United States Patent
Miyoshi

(12) 
(10) Patent No.: US 6,323,056 B1
(45) Date of Patent: Nov. 27, 2001

(54) SOLAR CELL, METHOD FOR MANUFACTURING SAME, AND PHOTOLITHOGRAPHIC MASK FOR USE IN MANUFACTURING A SOLAR CELL

(75) Inventor: Kozo Miyoshi, Saitama (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/402,513
(22) PCT Filed: Mar. 9, 1999
(86) PCT No.: PCT/JP99/01130
  § 371 Date: Oct. 5, 1999
  § 102(e) Date: Oct. 5, 1999
(87) PCT Pub. No.: WO00/07249
  PCT Pub. Date: Feb. 10, 2000

(30) Foreign Application Priority Data

Jul. 27, 1998 (JP) .................................................. 10-210739

(51) Int. Cl.$^7$ .................................................... H01L 31/04
(52) U.S. Cl. .......................... 438/80; 136/244; 136/249; 136/256; 136/258; 257/53; 257/443; 438/73; 438/96; 438/98; 438/57; 438/66
(58) Field of Search ............................ 136/244, 249 MS, 136/256, 258 AM; 257/53, 443; 438/73, 80, 96, 98, 57, 66

(56) References Cited

U.S. PATENT DOCUMENTS

| 4,419,530 | * | 12/1983 | Nath ..................................... 136/251 |
| 4,758,526 | * | 7/1988 | Thalheimer ........................... 136/244 |
| 5,963,790 | * | 10/1999 | Matsumo et al. ...................... 438/72 |

FOREIGN PATENT DOCUMENTS

| 61-229370 | * | 10/1986 | (JP) . |
| 63-308316 | * | 12/1988 | (JP) . |
| 2-189981 | * | 7/1990 | (JP) . |
| 4-116986 | * | 4/1992 | (JP) . |

* cited by examiner

Primary Examiner—Alan Diamond
(74) Attorney, Agent, or Firm—Greer, Burns & Crain, Ltd.

(57) ABSTRACT

A high-quality solar cell is manufactured that prevents contamination of solar cell boundaries. A transparent conductive film, an amorphous silicon film, and a metallic electrode are continuously laminated onto a substrate, and etching is done of the transparent conductive film, the amorphous silicon film, and the metallic electrode, using a photoresist film having stepped thickness to achieve the desired shape. Insulation between solar cell elements is provided via a prescribed protective film, after which an electrically conducive paste is formed so as to make a series connection between solar cell elements.

14 Claims, 7 Drawing Sheets

Fig. 3
PRIOR ART
(A) 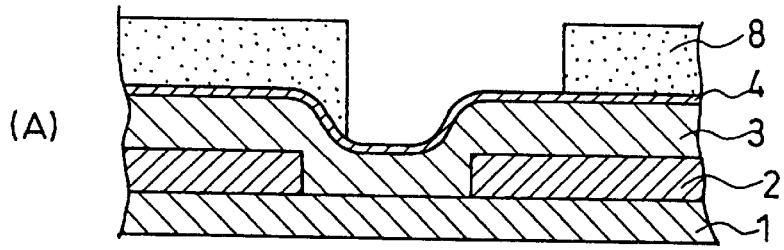
(B) 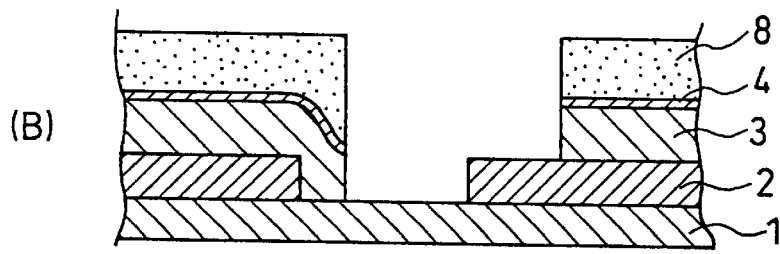
(C) 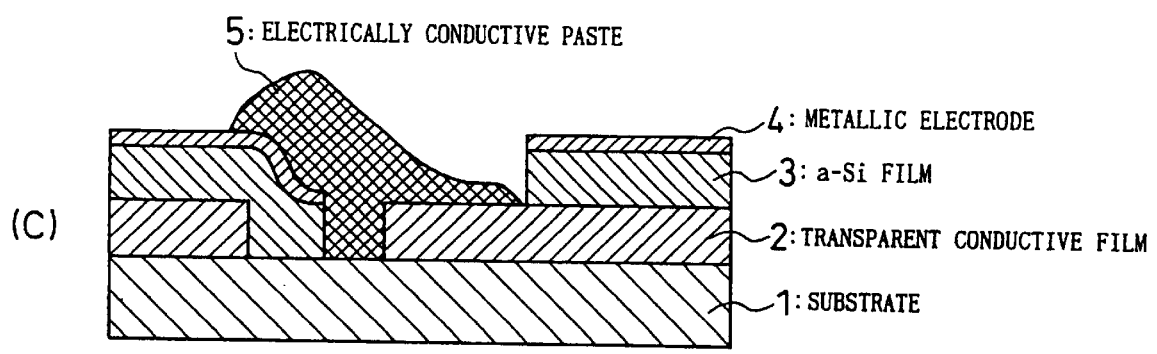

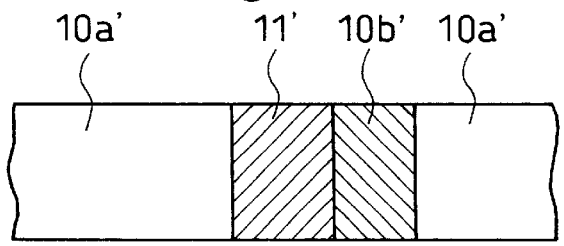
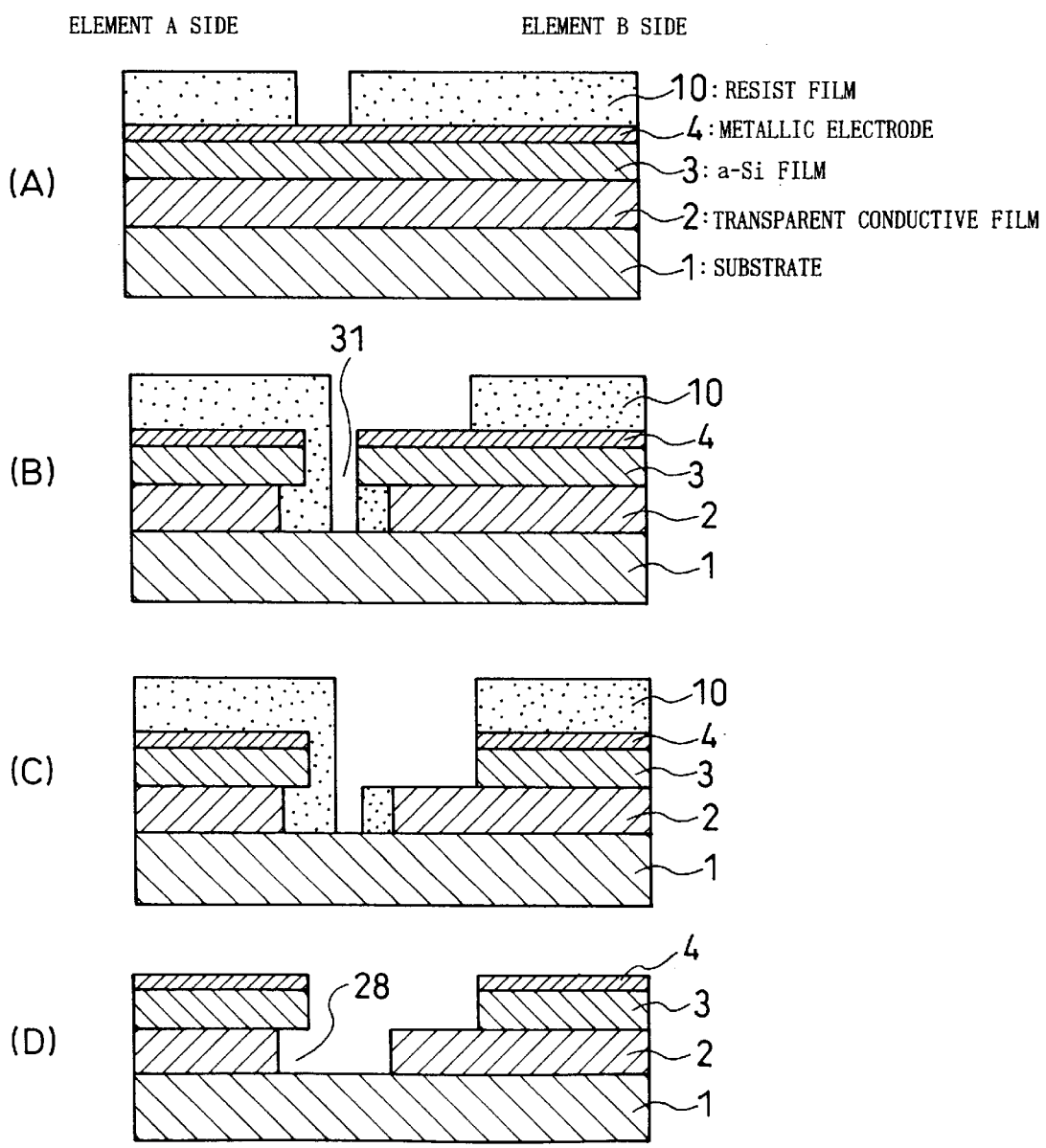

Fig. 9
ELEMENT A SIDE   ELEMENT B SIDE
(A)
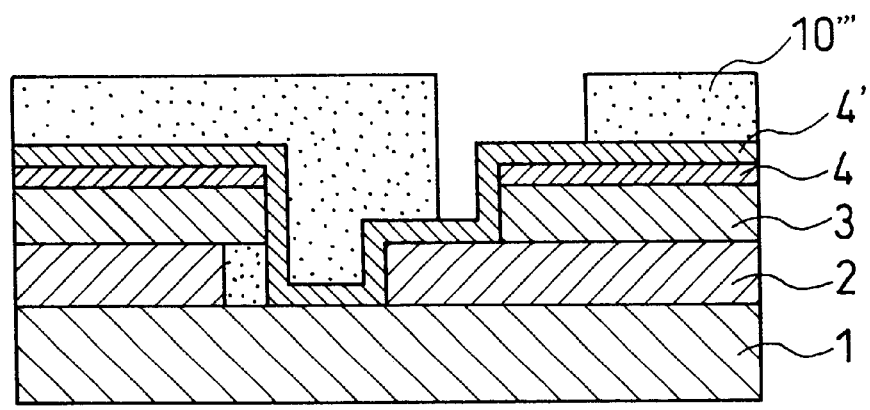
(B)
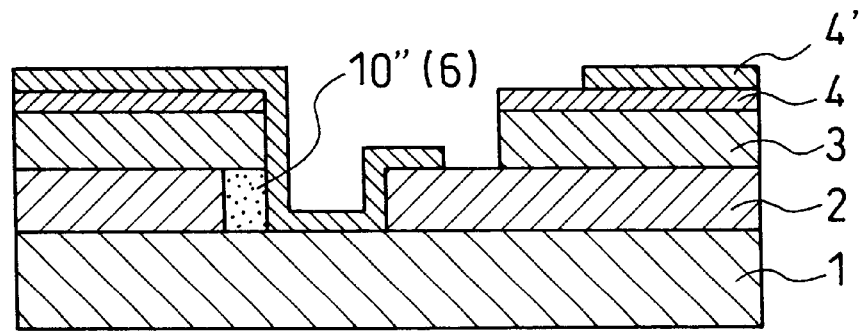

SOLAR CELL, METHOD FOR MANUFACTURING SAME, AND PHOTOLITHOGRAPHIC MASK FOR USE IN MANUFACTURING A SOLAR CELL

FIELD OF THE INVENTION

The present invention relates to a solar cell formed by an electrode and an amorphous silicon film on a substrate, and to a method for manufacturing such as solar cell.

BACKGROUND TECHNOLOGY

In a solar cell that is formed by an electrode and a P-I-N junction type amorphous silicon layer on a substrate, because the electromotive force of the silicon layer during operation is only 0.4 to 0.5 volts, when using the cell as a power source for, for example, an electronic wristwatch, it is not possible to charge a nickel-cadmium battery, i.e., secondary cells with this single solar cell.

Essentially, a single solar cell does not provide sufficient voltage to operate the necessary circuitry.

Because of the above-noted situation, an approach that is taken is that of placing a plurality of (for example, four) solar cells on a substrate, and connecting these solar cells in series so that the voltages thereof are added.

FIG. 2(F) shows a schematic cross-sectional representation of the structure of a solar cell of the past.

In this solar cell, a transparent conductive film 2 is formed on a glass substrate 1, and onto this a P-I-N junction type amorphous silicon film (hereinafter abbreviated as a-Si film) 3 is formed, over which a metallic. electrode 4 is further formed.

By the action of light that is incident to the substrate 1 from the bottom thereof, a photo-electromotive force that develops on the a-Si film can be extracted from the transparent conductive film 2 and the metallic electrode 4, which surround the a-Si film.

The structure of the laminate on the substrate as shown in FIG. 2(F), is divided to the left and right portions at approximately the center thereof, so that separate solar cells regions are formed on either side of the division.

As a convenience, the left and right solar cells will be referred to as elements A and B, respectively. The metallic electrode 4 of the element A is linked to the transparent conductive film 2 of the element B, thereby forming a series connection between the two elements.

Even in locations that are outside the range of FIG. 2(F), there are electrical connections between the metallic film 4 and the transparent conductive film 2 of neighboring elements, thereby forming a series connection between a plurality of solar cells that are formed on the substrate 1, so as to form a solar cell of the desired electromotive force.

A method for manufacturing a solar cell having the above-noted construction is briefly described below, with reference being made to FIG. 2.

As shown in FIG. 2(A), a transparent conductive film 2 is formed on the substrate 1 as an $SiO_2$ film, using a CVD process such as thermal CVD. In order to etch this transparent conductive film 2, a photoresist film 7 is formed thereon, using photolithography.

Next, using the photoresist film 7 as a mask, the transparent conductive film 2 is etched, so as to remove the parts of the transparent conductive film 2 that are not masked by the photoresist film 7, thereby patterning the transparent conductive film 2.

After this is done, the photoresist film 7 is peeled away, thereby forming the transparent conductive film 2 into the electrodes having a desired pattern, as shown in FIG. 2(B).

Then, as shown in FIG. 2(C), a CVD process is used to laminate an a-Si film 3 over the transparent conductive film 2, and a photoresist film 8 is formed thereover using photolithography, for the purpose of etching the a-Si film 3.

Next, as shown in FIG. 2(D), using the photoresist film 8 as a mask, etching is performed once again, so as to pattern the a-Si film 3 into a desired pattern, and the photoresist film 8 is then peeled away, so as to form the a-Si film 3 into the desired shape.

Additionally, as shown in FIG. 2(E), a metallic film that will serve as the metallic electrode 4 is grown by sputtering over the entire surface of the transparent conductive film 2 and the a-Si film 3, and a photoresist film 9 for the purpose of etching them is formed thereon, using a third photolithography process.

Finally, as shown in FIG. 2(F), the photoresist film 9 is used as a mask to perform a third etching process, so as to pattern the metallic electrode 4, and the photoresist film is then peeled away.

The above process steps achieve the desired shape on the multi-layered portion formed on the substrate, with each region formed as a solar cell, an electrical connection being made between the metallic film 4 of the element A and the transparent conductive film 2 of the element B, thereby forming a series connection between elements A and B.

In another example of the past, as shown in FIG. 3(A), simultaneously with the lamination of the a-Si film 3 onto the transparent conductive film 2 with CVD method as shown in FIG. 2(C), the metallic electrode 4 is laminated, by performing an additional photolithography process to form a photoresist film 8 for the purpose of either simultaneously etching the metallic film 4 and the a-Si film 3, or etching the metallic electrode and then the a-Si film 3, the desired patterning being achieved on the metallic electrode 4 and the a-Si film 3, and the photoresist film 8 being then peeled away. By doing this, the desired shape is achieved for the metallic electrode 4 and the a-Si film 3.

Finally, an appropriate electrically conductive paste 5 is used to make a connection between the metallic electrode 4 of one solar cell element and the transparent conductive film 1 of another solar cell element, thereby forming the solar cell.

In either of the above-noted past examples, solar cell elements outside the range of the drawings have the same type of configuration, a plurality of solar cell elements formed on the substrate 1 being connected in series, so that a combined electromotive force is generated. After the above steps are performed, the solar cell is completed by applying a protective film over the upper surface.

In a method for manufacturing a solar cell in the past, however, etching is performed either two or three times, this being the etching of the transparent conductive film 2 of FIG. 2(B), the etching of the a-Si film 3 of FIG. 2(D), and the etching of the metallic electrode 4 of FIG. 2(F).

Because before performing each of the etching steps, a photoresist film is formed, photolithography is performed either two or three times, and three types of masks, having different patterns, are required to perform these photolithography steps.

Additionally, while a film is not contaminated by the etching step alone after it is formed, when the steps of patterning or etching and resist peeling are performed, there is an unavoidable film surface contamination. Additionally, even if sufficient cleaning is performed, it is impossible to avoid residues of contamination and water on the surface.

In a solar cell, because the boundary between the transparent conductive film and an a-Si film and the boundary between the a-Si film and the metallic electrode form paths for the movement of electrons and holes, contamination of these boundaries greatly affect the characteristics of the solar cell.

Therefore, if a single photolithography step were sufficient, in addition to a shortening of the manufacturing process, it would be possible to suffice with only one type of mask, thereby achieving a great reduction in manufacturing cost.

Additionally, if it is possible after forming the transparent conductive film, the a-Si film and the metallic electrode film over the entire surface to perform patterning and achieve a series connection of cells, it is possible to precisely control the boundaries between films, enabling the manufacture of a high-quality solar cell. Because film formation is performed by a single continuous step, there is a great shortening of the manufacturing process.

Accordingly, it is an object of the present invention to provide an improvement over the drawbacks of the method for manufacturing a solar cell of the past, by providing a high-quality solar cell made by a simplified manufacturing method, and a method for manufacturing such a high-quality solar cell.

DISCLOSURE OF THE INVENTION

To achieve the above-noted objects, the present invention adopts the basic technical constitution described below.

Specifically, the first aspect of the present invention is a solar cell which has plurality of solar cell elements formed by a transparent conductive film, an amorphous silicon film, and a metallic electrode which are laminated in this sequence onto a substrate, these solar cell elements being disposed so as to be mutually neighboring, wherein between the edge parts of each of the solar cell elements or between mutually neighboring solar cell elements, a protective film is provided at the edge parts of each solar cell element or between neighboring solar cell elements, for the purpose of achieving insulation within a solar cell element or achieving insulation between neighboring solar cell elements, and further wherein an appropriate conductive material makes a series connection between neighboring solar cell elements. The second aspect of the present invention is a method for manufacturing a solar cell which has a plurality of solar cell elements formed by a transparent conductive film, an amorphous silicon film, and a metallic electrode, these being disposed in mutual proximity on a substrate, wherein after continuously laminating a transparent conductive film, an amorphous silicon film, and a metallic electrode film in this sequence, photolithography is used to perform patterning of the resulting laminate.

BRIEF DESCRIPTION OF THE DRAWINGS

FIGS. 3(A)–3(C) are cross-sectional views that show an example of another method of manufacturing a solar cell of the past.

FIG. 5 is a drawing that shows an example of a mask pattern for photolithography that is used in an example of a method for manufacturing a solar cell according to the present invention.

FIGS. 6(A)–6(D) and FIGS. 7(A)–7(B) are drawings that illustrate other examples of methods of manufacturing a solar cell according to the present invention.

FIGS. 9(A)–9(B) are drawings that illustrate the process steps in yet another example of a method of manufacturing a solar cell according to the present invention.

DESCRIPTION OF THE PREFERRED EMBODIMENTS

Preferred embodiments of a solar cell and a method for manufacturing a solar cell according to the present invention are described in detail below, with references being made to relevant accompanying drawings.

Figure 1:
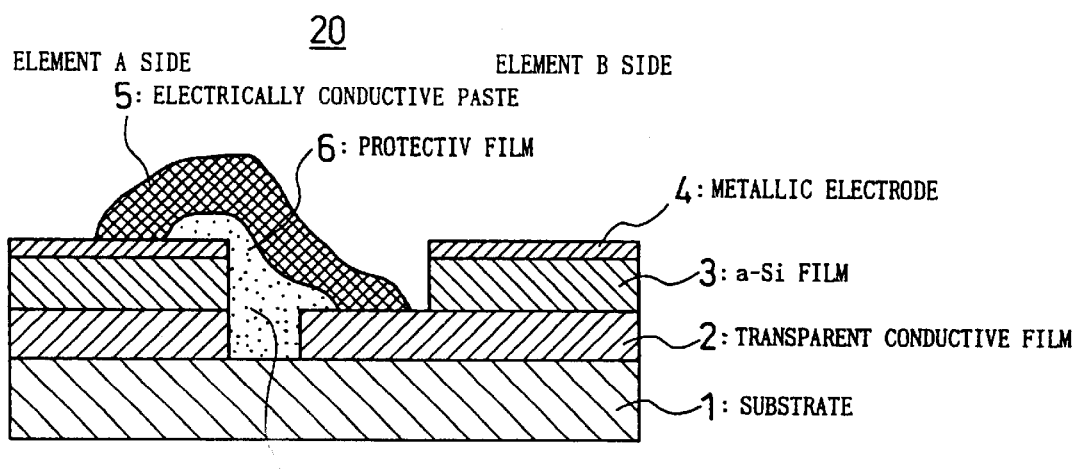
FIG. 1 is a cross-section view that shows the construction of a specific example of a solar cell according to the present invention.

Specifically, FIG. 1 is a cross-section view that shows the configuration of an example of a solar cell according to the present invention, this drawing showing a solar cell 20 having a plurality of solar cell elements A and B that are formed by a transparent conductive film 2, an amorphous silicon film 3, and a metallic electrode 4 are laminated in this sequence onto a substrate 1 are disposed so as to be mutually neighboring, wherein a protective film 6 is provided at the edge parts of solar cell elements A and B or between neighboring solar cell elements, for the purpose of achieving insulation within a solar cell element or achieving insulation between neighboring solar cell elements, and further wherein an appropriate conductive material 5 makes a series connection between neighboring solar cell elements A and B.

The insulation that is to be achieved by protective film 6 used in the solar cell elements A and B of the solar cell 20 can be an electrical insulation between the metallic electrode 4 and the transparent conductive film 6 within the solar cell elements A and B, and is an electrical insulation between individual transparent conductive films 2 of the solar cell elements A and B.

Additionally, the conductive material 5 that is used in the present invention is preferably disposed so as to make contact with the protective film 6, and is further desirably a photosensitive resin.

The conductive material 5 that is used in the present invention is preferably an electrically conductive paste, such as a carbon paste or a silver paste. It is desirable that, in each of the solar cell elements A and B of the present invention, at least one end of the element formation region in which the transparent conductive film 2, the amorphous silicon film 3, and the metallic electrode film 4 are laminated in this sequence forms a common flat-surface part 21, and further that the protective film 6 is provided so that it makes contact with this flat-surface part. 21.

Next, a specific example of the present invention will be described in detail.

Specifically, the present invention simplifies the photolithography process, and in order to do that the photoresist film 10 that is formed by photolithography is formed by a thin part 10b and a thick part 10a.

Figure 4:
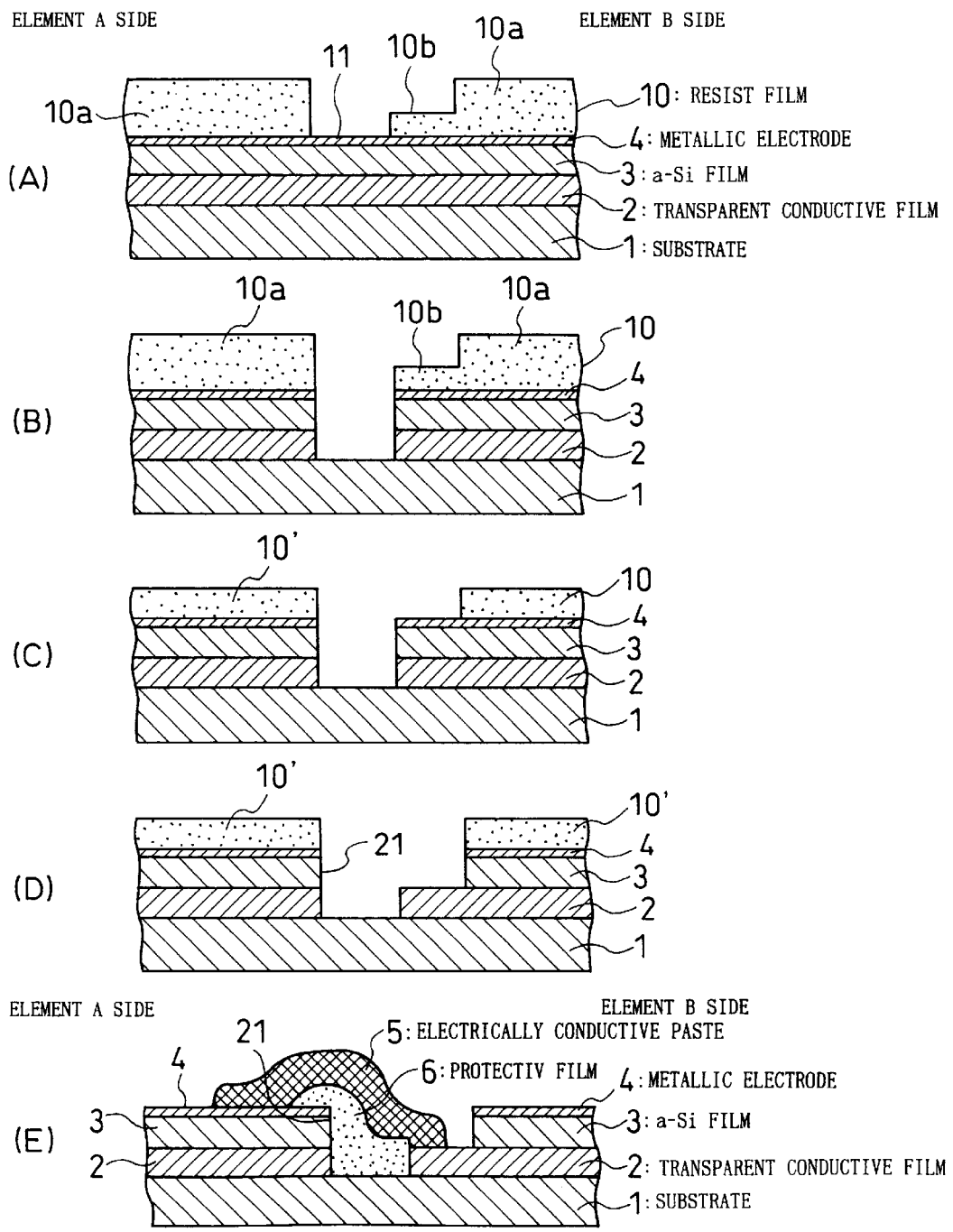
FIGS. 4(A)–4(E) are drawings that illustrate by example the manufacturing steps in a method of manufacturing a solar cell according to the present invention.

As shown in FIG. 4, a transparent conductive film 2 and a-Si film 3 are first formed on the substrate 1, and then the metallic electrode film 4 is formed over the entire surface, photolithography being then performed to achieve the above-noted photoresist film 10, which has an aperture 11 and a photoresist film parts 10a and 10b, which have different thicknesses.

Using the above-noted photoresist film, etching is performed so as to commonly pattern the entire laminate on the substrate 1.

Next, plasma is used to remove (by ashing) the photoresist film 10, and when this is done, rather than removing the entire photoresist film 10, the ashing proceeds so as to reduce the thickness of the photoresist film, the ashing being stopped at a point at which the thin part thereof has been removed but at which the thick part thereof remains.

Using the remaining photoresist film etching is performed again, this time patterning the metallic electrode 4 and the a-Si film 3.

Stated in other terms, the first etching patterns the transparent conductive film 2 together with the metallic electrode 4 and the a-Si film 3, and the second etching patterns the metallic electrode 4 and the a-Si film 3. By doing this, the three photolithography steps used in the past to form the photoresist film are reduced to just one step.

In the technology of the past, the method of forming a photoresist film was, for example, one in which when performing photolithography to form the photoresist film 10, a photoresist material 10 was applied to the laminate surface on the substrate 1, a mask and an exposure system being used to expose the photosensitive resist surface. With a resist material in which exposure to light results in the breaking of main chains, the main chains will break, causing softening in the part exposed to light, thereby increasing the solubility of this part with respect to the developer, whereas the unexposed parts are not so affected, so that the exposed parts are washed away at the time of developing, and the unexposed parts remain so as to serve as a mask for etching.

In the above-noted case, the exposed parts of the resist material of the mask pattern are transparent, and the parts that are not exposed are opaque to light.

In the present invention, however, because a thick part and a thin part are provided in the photoresist film, as noted above, there is formed a photoresist film 10 which has at least two steps of differing thicknesses.

For this reason, the exposure mask that is used in the present invention is so configured that it is provided with three portions and a first portion used for making an aperture in the resist film, is transparent so that sufficient exposure is applied to the resist film, a second portion thereof used for making thick portions in the resist film is completely opaque and a third portion thereof used for making thin photoresist film is forming a type of net pattern in that a transmission pattern having dimensions smaller than the resolution of the exposure system is mixed with the light-blocking pattern.

By exposing via the above-noted type of fine pattern, because each pattern element is below the resolution of the exposure system, these parts are not transferred as is to the resist material, but are exposed by an insufficient amount of light.

Therefore, the main chains are cut in only part of the resist material thickness, resulting in a washing away of these part only after exposure, the remaining part of the thickness being hardened, so that it forms the thin photoresist film.

An embodiment the present invention is described below in detail, with reference being made to drawings.

FIG. 4 is a drawing that shows the manufacturing process steps for a solar cell according to the present invention.

As shown in FIG. 4(A), a transparent conductive film 2, an a-Si film 3, and a metallic electrode 4 are laminated in this sequence onto the substrate 1, over which laminate a photoresist film 10 is formed, using photolithography.

Although only the thick part 10a of the photoresist film on the solar cell element A is visible, both the thick part 10a and the thin part 10b of the photoresist film of the solar cell element B are visible.

Resist is not provided in the location of the aperture 11.

In this embodiment, a resist material 10 is used which is softened by exposure to light.

Additionally, the photolithography mask that is used in the present invention uses the thick part 10a of the photoresist film 10 as a mask, and use a passing light through the part 11 in which there is no resist film. The thin transparent portion for part 10b of the photoresist film has a mixed pattern formed by light-transmitting parts and light-blocking parts.

FIG. 5 shows an example of the mask pattern, with the parts that correspond to FIG. 4(A) marked with reference numerals. The parts 10a on either side that correspond to the thick resist film are light-transmitting parts, the part 11 in which there is no photoresist film provided is a light-blocking part, and the part 10b with a thin resist film has provided in it a checkerboard pattern consisting of a mixture of a fine light-transmitting pattern and a light-blocking pattern.

One side of the fine pattern is below the resolution of the exposure system, so that for example one side of the pattern is 5 $\mu$m if the resolution of the exposure system is 10 $\mu$m.

Using this type of pattern to perform exposure, the pattern is not transferred to the photoresist film, exposure being made with an insufficient amount of light, the result being that the hardened thickness of the resist material is thinner than the completely transparent part, such as 10a, resist material that was not sufficiently softened being washed away by development after exposure, this resulting in a thin resist film part 10b, such as seen in FIG. 4(A).

The fine mask pattern, in addition to that shown in FIG. 5, can be various patterns, such as a stripe pattern or a matrix pattern, and it is also possible to control the photoresist film thickness by appropriately selecting the ratio of surface area of the light-transmitting part and the light-blocking part.

In contrast with the example given above, it is also possible for the resist material to be one in which the exposed part hardens, in which case the light-transmitting and light-blocking parts of the mask will be reversed.

As described above, it is desirable that the photolithography mask that is used in the present invention be one that has a light-transmitting part, a light-blocking part, and a partially light-transmitting part, which transmits an amount of light that is intermediate between the amounts of light that are transmitted through the light-blocking part and the light-transmitting part.

Additionally, it is desirable that the partially light-transmitting part of the mask used in the present invention be a light-transmitting part that has a dimension that is below the resolution of the exposure system.

The above-noted partially light-transmitting part is preferably formed by an alternating or matrix arrangement or checkerboard arrangement of light-transmitting parts that have minute surface areas and light-blocking parts having minute surface areas.

After the above, as shown in FIG. 4(B), etching is performed using the stepped resist film 10 as noted above, so as to perform patterning of the transparent conductive film 2 as well as the a-Si film 3 and the metallic electrode 4 laminated on the transparent conductive film 2, in one continuous operation.

Next, as shown in FIG. 4(C), an ashing process is performed so as to remove the photoresist film 10.

Plasma is used in this operation, and as the ashing process is progressed, the thickness of both resist film 10a and 10b are reduced, but in the present invention, it is not the object to remove all of the resist film 10 but the ashing processing being stopped when the progress of the ashing reaches a point at which the thin photoresist film part 10b having been completely removed.

As a result, while the thickness of the part 10a of the resist film is reduced from what it was before, this remains as the photoresist film 10'.

Next, as shown in FIG. 4(D), the photoresist film 10' that was left remaining as noted above is used to perform etching once again, so as to pattern the a-Si film 3 and the metallic electrode 4 at the same time.

After the above, the photoresist film 10' is peeled away.

Next, as shown in FIG. 4(E), a protective film 6 is printed onto the solar cell element A and the solar cell element B that are formed as described above, so as to prevent short circuits between electrodes, which are short circuits between the transparent conductive films 2 of neighboring solar cell elements A and B, and also to prevent short circuits and the like between the transparent conductive film 2 and metallic electrode 4 within one and the same element A or B, an electrically conductive paste 5 being applied so as to straddle the protective film 6, so as to make an electrical connection between the transparent conductive films 2 of the solar cell element B and the metallic electrode 4 of the solar cell element B.

The same type of connection is made with respect to areas outside the range of the drawing, so that a plurality of solar cell elements formed on the substrate 1 are connected in series, the result being that the synthesized electromotive forces there of are added. After this is done, a protective film is applied to upper surface, thereby completing the solar cell.

Figure 2:
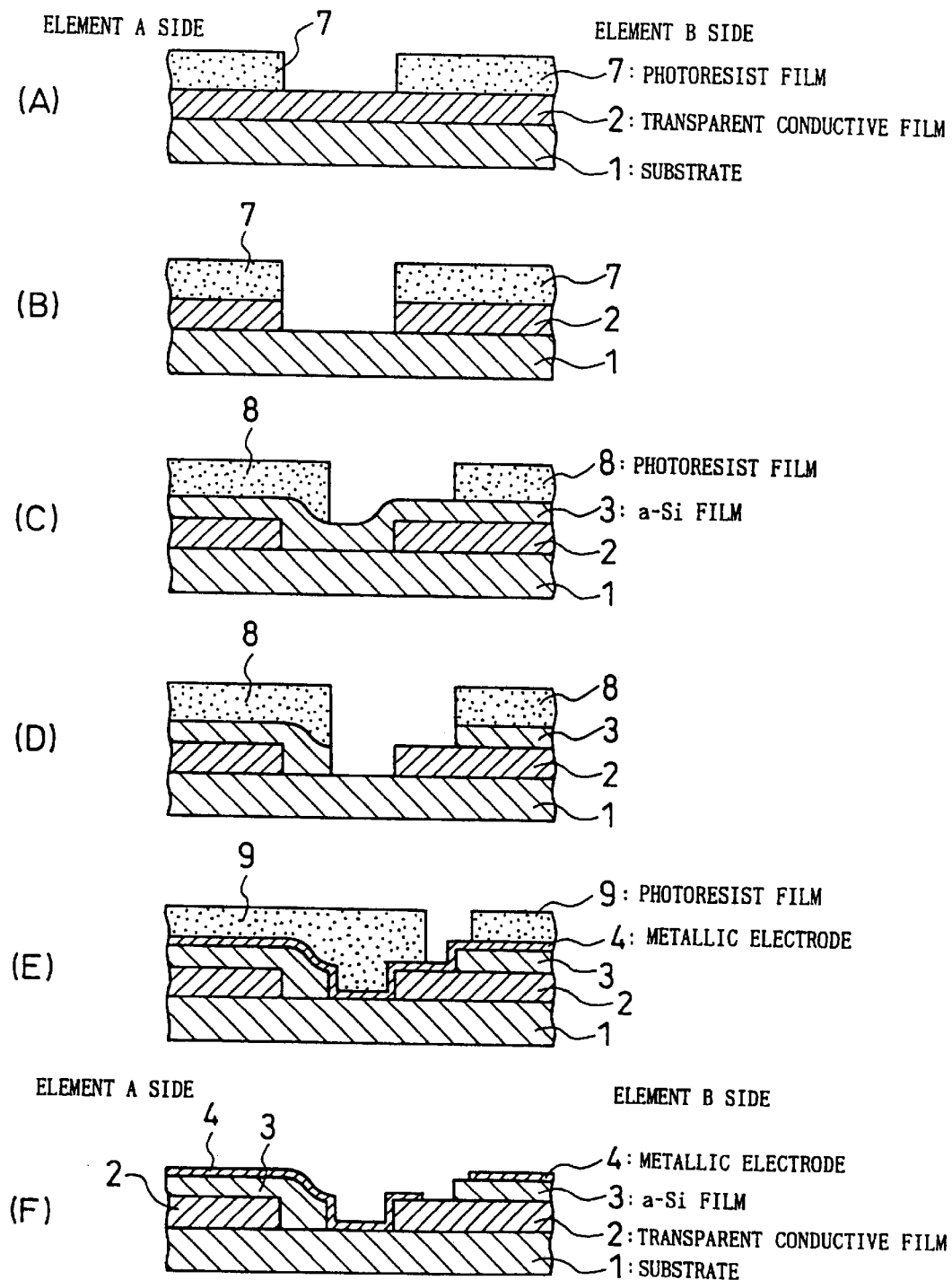
FIGS. 2(A)–2(F) are drawings that show an example of the manufacturing steps according to a method of manufacturing a solar cell of the past.

Comparing the method of manufacturing a solar cell of FIG. 4 with the past method for manufacturing a solar cell shown in FIG. 2, in the method of the past, photolithography is performed three times, as shown in FIGS. 2(A), (C), and (E) in forming photoresist films, etching being performed three times, as shown in FIGS. 2(B), (D), and (F).

In contrast to this, in the present invention photolithography is used only one time, a shown in FIG. 4(A), to form a photoresist film 10.

Additionally, in the present invention etching is performed two times, as shown in FIGS. 4(B) and (D).

In the method of manufacturing a solar cell of the past, in contrast to the method for manufacturing a solar cell of the past, in which the etching processing steps of FIGS. 2(B), (D), and (F) are separated by the film formation and photolithography steps of FIGS. 2(C) and (E), in the present invention, between the etching steps of FIGS. 4(B) and (D), there is only the ashing process step of FIG. 4(C) intervening, and no film formation and photolithography process steps.

Furthermore, both etching and ashing use plasma, the same type of process, to remove the surface layer of the substrate, so that the process steps of FIGS. 4(B), (C), and (D) can be performed with the substrate in one and the same processing chamber, the gas type and concentration only being switched in order to achieve continuous processing.

Therefore, compared with the method of the past, the manufacturing method according to the present invention can be said to reduce the number of process steps to one-third. Additionally, whereas the method of the past required different masks for each of the three photolithography process steps, the method of the present invention requires just one type of photolithography mask, this representing a reduction in cost.

In addition, a protective film 6 is provided between the solar cell elements A and B, as shown in FIG. 4(E), and an electrically conductive paste 5 is applied, so as to form a structure in which there is a connection made between the metallic electrode 4 of the solar cell element A and the transparent conductive film 2 of the solar cell element B, this structure being absent from the solar cell of the past shown in FIG. 2(F).

With the structure of the past as shown in FIG. 2(F), the end part of the transparent conductive film 2 of the solar cell element A is covered with the a-Si film 3, the metallic electrode 4 of the solar cell element A and the transparent conductive film 2 of the solar cell element B being thereby separated, so that it is not necessary to provide a protective film 6 for providing an insulation, it being possible to use film formation and patterning to achieve the desired connection between the metallic electrode 4 of the solar cell element A and the transparent conductive film 2 of the solar cell element B. With the present invention, however, as shown in FIG. 4(E), the end part of the transparent conductive film 2 of the solar cell element A is not covered with the a-Si film 3, and it is not possible to achieve a connection between the metallic electrode 4 of the solar cell element A and the transparent conductive film 2 of the solar cell element B using film formation and patterning, which is why electrically conductive paste is used, and this a distinctive feature of the present invention.

In the above-described example of the present invention, while the example was one in which the present invention was applied to a solar cell that is formed on a glass substrate 1, it is intrinsically possible to apply the present invention to the case in which a metal sheet or the like onto which is formed non-transparent insulating sheet or insulating covering is used as the substrate 1, in which case the sequence of lamination that is used to form the solar cell is reversed.

An example of a method for manufacturing a solar cell according to the present invention is one whereby a solar cell is manufactured, this solar cell having a plurality of solar cell elements A and B, which are formed by a transparent conductive film 2, an amorphous silicon film (a-Si film) 2, and a metallic electrode film 4 on a substrate 1, wherein after the transparent conductive film 2, the amorphous silicon film 3, and the metallic electrode film 4 are continuously laminated in this sequence, photolithography technology is used to perform patterning of the resulting laminate.

In a method for manufacturing a solar cell according to the present invention, the patterning processing is preferably performed by means of one resist application step and two etching steps.

It is further preferable that there is provided a resist film patterning step whereby an aperture 11, and at least two mask parts 10a and 10b, these having different thicknesses, are formed on the photoresist film 10 that is formed by the resist application step.

Additionally, it is desirable in the method for manufacturing a solar cell according to the present invention, that in the resist film patterning step a thin mask part 10*b* of the photoresist film 10 be disposed so as to make contact with or to put the thin mask part 10*b* adjacently to the aperture 11 that is formed in the photoresist film 10.

It is further desirable in the present invention that in the photoresist film patterning step, a mask be used that has a light-blocking part 10*a*', a light-transmitting part 11', and an impartially light-transmitting part 10*b*', which transmits an amount of light that is intermediate between the amounts of light that are transmitted by the light-blocking part 10*a*' and the light-transmitting part 11', The impartially light-transmitting part 10*b*' of the present invention is, for example, made up of light-transmitting parts that have a dimension that is beyond the resolving power of the exposure system.

A more specific configuration of a method for manufacturing a solar cell according to the present invention is that of a method of manufacturing a solar cell, this solar cell having a plurality of solar cell elements that are arranged in mutual proximity, these cells being formed by a transparent it conductive film, and amorphous silicon film, and a metallic electrode film that are formed on a substrate, this method having a step of continuously laminating on the substrate a transparent conductive film, an amorphous silicon film, and a metallic electrode film, in this sequence, a step of forming a photoresist film having stepped thickness onto the above-noted laminate for the purpose of patterning the laminate and performing patterning so as to form an aperture therein at a prescribed location, a step of using the photoresist film as a mask to perform a first etching process, and then removing the photoresist film until a thin part of the photoresist film is removed, and a step of using the remaining photoresist film on the substrate as a mask to perform a second etching process.

In the above-noted method for manufacturing a solar cell according to the present invention, it is possible to add a step of, after removing the remaining photoresist film after the second etching step, forming a protective film that provides insulation either between a transparent conductive film and a metallic electrode within a solar cell element, or between the transparent conductive films of neighboring solar cell elements, and a step forming an electrically conductive paste via the protective film so as to make an electrical connection between the metallic electrode of one solar cell element in a solar cell and the transparent conductive film within another solar cell element in the solar cell.

In the above-noted method for manufacturing a solar cell according to the present invention, it is desirable that the first etching process be one in which the transparent conductive film, the amorphous silicon film, and the metallic electrode film that part that corresponds to the aperture of the photoresist film being patterned simultaneously, and further desirable that the second etching processing be one whereby the amorphous silicon film and the metallic electrode film that correspond to the aperture of the photoresist film are patterned simultaneously.

Next, a second example of a method of solar cell and a manufacturing a solar cell according to the present invention will be described in detail, with reference to the drawings.

Figure 8:
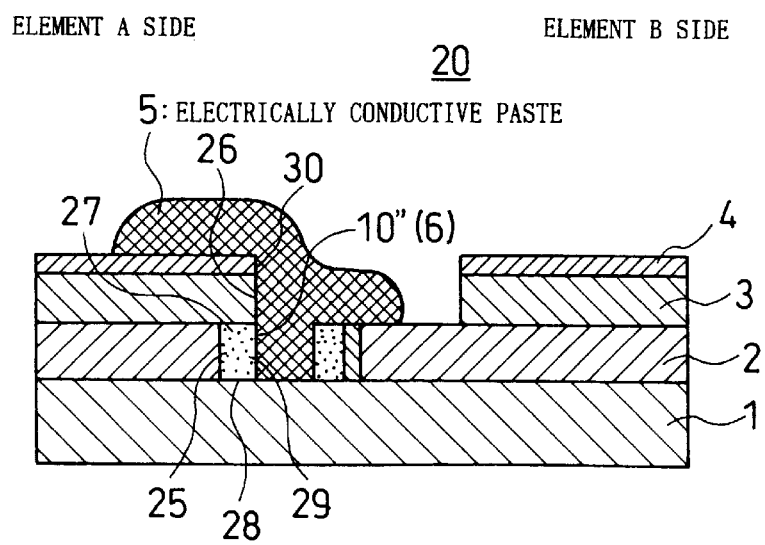
FIG. 8 is a cross-section view that show the construction of another example of a solar cell according to the present invention.

Specifically, in the configuration of the second example of a solar cell according to the present invention, as shown in FIG. 8, is that of a solar cell 20 that has a plurality of solar cell elements A and B that are formed by a transparent conductive film 2, an amorphous silicon film 3, and a metallic electrode 4 which are laminated in this sequence onto a substrate 1, these solar cell elements being arranged so as to be in mutual proximity, wherein at at least one end part at one end of the element formation region in which the transparent conductive film 2, the amorphous silicon film 3, and the metallic electrode film 4 are laminated in this sequence, at least one end portion 25 of said transparent conductive film 2 is set-backed inwardly, so that the end thereof takes its position locating inside of one end of the amorphous silicon film 3.

Additionally, in the solar cell 20 of this example of the present invention, a protective film 6 is disposed so as to be inserted in a space 28 formed with the recessed end part 26 of the transparent conductive film 2 and the bottom edge 27 of the amorphous silicon film 3 of the element formation region that make up said solar cell elements A and B.

In the above-noted example of a solar cell 20, an electrically conductive paste 5 is formed so as to be disposed so as to make contact with said end portion 29 of said protective film 6 as well as with the end parts 30 of said amorphous silicon film 3 and said metallic electrode 4 of one solar cell element, and also so as to make contact with said transparent conductive film 2 of another, neighboring solar cell element to above-mentioned one solar cell.

Additionally, in the solar cell 20 according to the present invention, it is also possible to have, as shown in FIG. 9(B), an electrically conductive material 4', which is formed so as to make contact with the end part 25 of the protective film 6 and the end parts 26 and 30, respectively, of the amorphous silicon film 3 and metallic electrode 4, in one of the solar cell elements, and also so as to make contact with the transparent conductive film 2 of the other, neighboring solar cell element of the solar cell elements A and B.

That is, a feature of the second example as well of a the solar cell 20 according to the present invention is the continuous lamination onto a substrate of a transparent conductive film 2, an a-Si film 3, and a metallic electrode film 4.

Next, photolithography is performed on the laminate and the resist therefrom is used to perform etching, so as to perform common patterning of the entire laminate on the substrate.

When this is done, when performing etching of the lowermost transparent conductive film 2, etching is performed under conditions which enable selective etching with respect to other films.

That is, etching is performed under conditions at which the etching rate of the transparent conductive film 2 is fast with respect to the etching of the metallic electrode film 4 and the a-Si film 3.

By doing this, the transparent conductive film 2 pattern is further inside than the other films, as shown in FIG. 6(C).

Additionally, after peeling away the resist, photolithography is performed again, using this resist pattern as a mask, so as to etch the metallic electrode film 4 and the a-Si film 3.

Additionally, a positive-type photoresist film is formed on the substrate 1, the entire substrate being exposed to light and then developed. By doing this, photoresist remains on only the part of the transparent conductive film 2 pattern that is further inside with respect to the metallic electrode film pattern, enabling insulation between the metallic electrode film and the transparent conductive film.

The second example of the present invention is described in detail below, with reference being made to the drawings.

Figure 7:
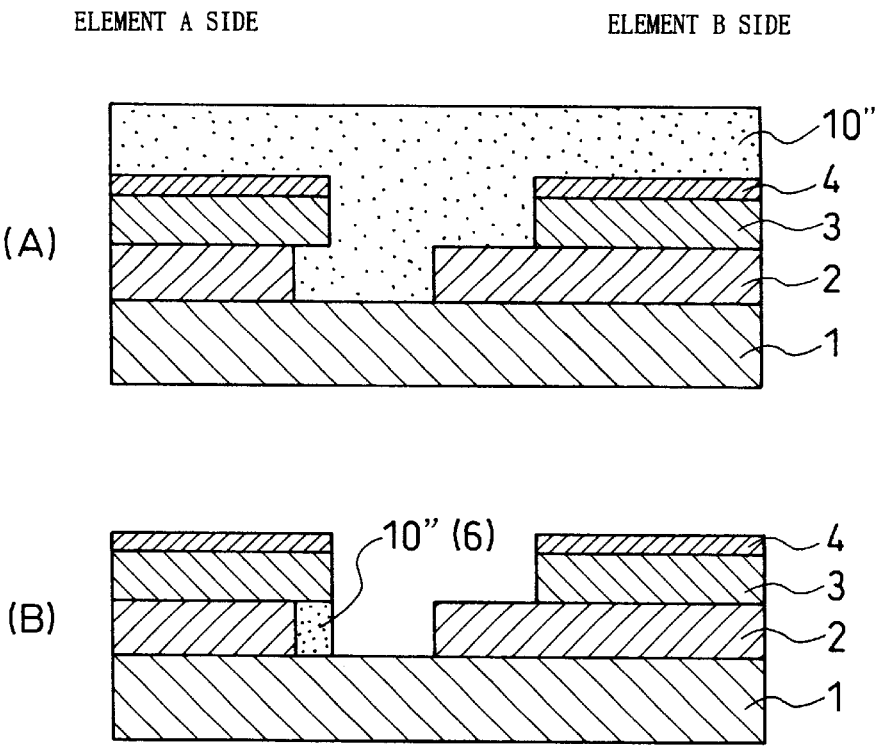

FIG. 6, FIG. 7, and FIG. 8 show the manufacturing process steps for the solar cell element of this example of the present invention.

In FIG. 6(A), the condition shown is that in which the transparent conductive film 2, the a-Si film 3, and the metallic electrode film 4 have been sequentially laminated on the substrate 1, and the photoresist film 10 has been formed thereover.

At this point, the case in which indium tin oxide (ITO) is used as the transparent conductive film 2 and titanium (Ti) is used as the metallic electrode film 4 will be described.

First, an ITO film is formed by sputtering. The sputtering conditions used are 100 sccm argon gas and 2 sccm oxygen gas introduced to within the sputtering apparatus, the pressure therewithin being 5 mTorr to 30 mTorr, sputtering being achieved by a plasma that is formed by the application a high-frequency (13.56 MHz) energy at a power of 1 kW to 3 kW.

Next, the a-Si film 3 is formed using a plasma CVD process. When this is done, to achieve a p-type a-Si film 3, 500 sccm silane gas and 0.1 sccm to 1 sccm diborane gas are introduced into the plasma CVD apparatus, the pressure therewithin being 0.5 Torr to 2 Torr, and the gas being broken down by plasma that is generated by applying high-frequency (13.56 MHz) energy at 50 W to 300 W, at a temperature of 250° C., the substrate 1 being placed over the electrode.

To achieve an i-type a-Si film 500 sccm silane gas is introduced into the plasma CVD apparatus, the pressure therewithin being 0.5 Torr to 2 Torr, and gas being broken down by plasma that is generated by applying high-frequency (13.56 MHz) energy at 50 W to 300 W, the substrate 1 being placed over the electrode kept at a temperature of 250° C.

To achieve an n-type a-Si film, 500 sccm silane gas and 0.1 sccm to 1 sccm phosphene gas are introduced into the plasma CVD apparatus, the pressure therewithin being 0.5 Torr to 2 Torr, and gas being broken down by plasma that is generated by applying high-frequency (13.56 MHz) energy at 50 W to 300 W, the substrate 1 being placed over the electrode kept at a temperature of 250° C.

Additionally, the formation of the titanium Ti film 4 is done using titanium as a target material, introducing 100 sccm argon gas into the sputtering apparatus, the pressure therewithin being 5 mTorr to 30 mTorr, sputtering being done with a plasma that is generated by application of high-frequency (13.56 MHz) at 1 kW to 3 kW.

After the above, as shown in FIG. 6(B), the above-noted photoresist film 10 is used as a mask pattern in etching the metallic electrode film 4 and the a-Si film 3. Then simultaneous patterning is performed of the transparent conductive film 2 and the a-Si film 3 and the metallic electrode film 4 which are laminated on the transparent conductive film 2, with same pattern.

When this is done, the etching conditions are such that the etching rate of the of the transparent conductive film 2 is faster than that of the metallic electrode film 4 or the a-Si film 3.

The etching of the titanium is done by introducing 100 sccm to 300 sccm BCl$_3$ gas and 30 scom to 100 sccm Cl$_2$ gas into a dry etching apparatus, the pressure therewithin being 50 mTorr, etching being done by a plasma that is generated by application of high-frequency (13.56 MHz) energy of 1000 W.

At this point, the etching of the a-Si film 3 is done by introducing 0 sccm to 200 sccm SF6 gas and 0 sccm to 200 sccm Cl$_2$ gas into a dry etching apparatus, the total pressure therewithin being 50 mTorr to 200 mTorr, etching being done by a plasma that is generated by the application of high-frequency (13.56 MHz) energy at 100 W to 1000 W.

The etching of the ITO film 2, which is the transparent conductive film, is performed by a mixed solution of ferric oxide, hydrochloric acid, and water, in ratio of 3:5:2.

By doing this, when etching the ITO film 2, only the etching of the ITO film 2 progresses, so that the transparent conductive film 2 is formed so that an end portion thereof is set backed from an end portion of the metallic electrode 4 an the a-Si film 3, as shown in FIG. 6(B). Next, the photoresist film 10 is first peeled away, and then photoresist film 10 having a pattern such as shown in FIG. 6(B) is formed again thereover.

This photoresist film 10 pattern is used as a mask to perform etching of metallic electrode 4 and the a-Si film 3 as noted above so as to obtain the shape shown in FIG. 6(C), after which the photoresist film 10 is peeled away so as to achieve the shape shown in FIG. 6(D).

FIG. 7(A) shows the condition in which a photoresist film 10 is applied again over the solar cell element, and overall exposure is done from the top, without using a photolithography mask, after which developing is done.

In the case of using a positive-type photoresist as the photoresist film 10, as shown in FIG. 7(B), photoresist remains only in the recessed portion formed by an end of the transparent conductive film 2, which is the ITO film and a bottom surface of the the patterned amorphous silicon film 3, this photoresist acting as a protective film 6 to prevent short circuits between solar cell elements A and B, short circuits between the transparent conductive film 2 and the metallic electrode film 4 of one and the same solar cell element, and short circuits between the transparent conductive films 2 of neighboring solar cell elements.

An electrically conductive paste 5 is applied by screen printing over the above so as to make a connection between the metallic electrode film 4 of the solar cell element A and the transparent conductive film 2 of the solar cell element B.

By the above-noted process steps, a solar cell 20 having the structure shown in FIG. 8 is obtained.

The same type of connections are made in the area beyond the range of the drawing, so that a plurality of solar cell elements formed on the substrate 1 are connected in series, the result being that an added voltage is generated. After this, a protective film is applied, thereby completing the solar cell.

Next, the construction and method for manufacturing a third example of a solar cell according to the present invention is described below.

First, the structure shown in FIG. 6(B) is obtained by a method the same as the second example noted above.

Additionally, a conductive film 4' of the same type as or a different type from the metallic electrode film 4 is sputtered onto the substrate 1.

In the case of using titanium Ti again, the conductive film forming operation is performed under the same film forming conditions as noted earlier. After this is done, a pattern is formed by the photoresist film 10''', thereby achieving the structure that is shown in FIG. 9(A). Then, the photoresist film 10''' pattern is used as an etching mask for etching, thereby obtaining the structure shown in FIG. 9(B).

By the above, a series connection is made between a plurality of solar cell elements A and B formed on the substrate 1, enabling the generation of a synthesized electromotive force. Then, an appropriate protective film is applied, thereby completing the solar cell 20.

Next, the method for manufacturing a solar cell according to the present invention will be described, with regard to the second example.

Specifically, the method for manufacturing a solar cell according to the present invention, is basically the same as described above with regard to the first example.

In this method for manufacturing a solar cell 20, which has a plurality of solar cell elements A and B, which are formed by a transparent conductive film 2, an amorphous silicon film 3, and the metallic electrode film 4 on a substrate, after continuously laminating the transparent conductive film 2, the amorphous silicon film 3, and the metallic electrode film 4 in this sequence, photolithography technology is used to perform patterning of the resulting laminate.

More specifically with regard to the method for manufacturing a solar cell according to the present invention, this is a method for manufacturing a solar cell having a plurality of solar cell elements formed by a transparent conductive film, an amorphous silicon fill, and a metallic electrode film in a substrate, these elements being in mutual proximity, wherein after a step whereby the transparent conductive film, the amorphous silicon film, and the metallic electrode film are continuously laminated in this sequence, a first photoresist film 10 having an aperture at a prescribed location is formed on the laminate for the purpose of patterning the laminate, this first photoresist film 10 being then used as a mask for the etching of the laminate, so as to form a trench 31 that reaches the substrate at a prescribed position on the laminate, simultaneously with which side end surface 25 of the transparent conductive film 2 is caused to be recessed to the inside of the side end surfaces 30 and 26, respectively, of the metallic electrode 4 and the amorphous silicon film 3, a protective film 6 being formed by causing a third photoresist film 10" to be inserted into a space 28 that is formed by the recessed side end wall 25 of the transparent conductive film 2 and the lower surface 27 of the amorphous silicon film 3.

In a method for manufacturing a solar cell according to this example, in the etching process that uses the first photoresist film, it is desirable that etching conditions be used under which the etching rate of the transparent conductive film be greater than the etching rate with respect to the metallic electrode and the silicon film.

Additionally, this example of the present invention is a method for manufacturing a solar cell that has a plurality of solar cell elements formed in mutual proximity by a transparent conductive film, an amorphous silicon film, and a metallic electrode film on a substrate, this method having a step of continuously laminating the transparent conductive film 2, the amorphous silicon film 3, and the metallic electrode film 4 in this sequence, a step of forming a first photoresist film 10 having an aperture in a prescribed position on the above-noted laminate for the purpose of patterning the laminate on the substrate, a step whereby when using the first photoresist film 10 as a mask to perform a first etching step as to form a pattern, etching conditions are used whereby the etching rate with respect to the transparent conductive film 2 is greater than the etching rate with respect to the metallic electrode film 4 and the amorphous silicon film 3, so that simultaneous with the formation of a trench 31 which reaches the substrate at a prescribed position on the substrate, the side end surface 25 of the transparent conductive film 2 is caused to be recessed to inside the side wall surfaces 30 and 26, respectively, of the metallic electrode 4 and the amorphous silicon film 3, a step whereby after removal of the first photoresist film 10, a second photoresist film 10' is applied over the entire surface of the laminate, after which the second photoresist film 10' is patterned so that part of the trench 31 and the metallic electrode 4 are open, a step of using the second photoresist film 10' as a mask to perform etching of the metallic electrode 4 and the amorphous silicon film 3 so as to remove them, a step of removing, if necessary, the second photoresist film 10 remaining on part of the space 28, using a resist peeling method and, after removing the second photoresist film 10, applying a third photoresist film 10" over the entire surface of the laminate, after which the third photoresist film 10" is removed so as to cause it to remain in the space 28.

It is desirable that the third photoresist film 10 in the above-noted example be a photosensitive resin.

After removing the third photoresist film 10", that there be an added step whereby an electrically conductive paste 5 is formed so as to make an electrical connection between the metallic electrode 4 of one of the solar cell elements A and B and the transparent conductive film 2 of the other solar cell element of the solar cell elements A and B that is disposed as to be adjacent to the first solar cell element.

Next, by way of description of the method of manufacturing according to the third example, there is the addition of a step whereby, in FIG. 7(B), after removing the third photoresist film 10", an electrically conductive film 4' is formed over the entire surface of the substrate, after which a fourth photoresist film 10''' is applied to the entire surface of the substrate, patterning being done so as to form an aperture at a part that corresponds to a part of the transparent conductive film 2 and part of the metallic electrode 41 in one of the solar cell elements B, and a step whereby the patterned fourth photoresist film 10''' is used as a mask to perform etching of a part of the transparent conductive film and a part of the metallic electrode 4', Additionally, it is desirable in the third example, that there be an added step of forming a protective film so as to insulate the transparent conductive films 2 of neighboring solar cell elements, and a step of forming an electrically conductive paste so that an electrical connection is made between the metallic electrode of one solar cell elements of neighboring solar cell elements and the transparent conductive film of another solar cell element of neighboring solar cell elements.

In the above-described examples of the present invention, although the examples provided were those in which the present invention was applied to a solar cell that is formed on a glass substrate, it is intrinsically possible to apply the present invention to the case in which a metal sheet or the like onto which is formed non-transparent insulating sheet or insulating covering is used as the substrate, in which case the sequence of lamination that is used to form the solar cell is reversed.

As described above, according to the present invention, in a method of manufacturing a solar cell by laminating an electrode and an amorphous silicon film onto a substrate, a transparent conductive film, an amorphous silicon film, and a metallic electrode film are continuously formed, after which etching is performed, with insulation between elements being achieved by a photosensitive resin, thereby enabling the manufacture of a solar cell without contamination of the boundary between the electrode film and the amorphous silicon film.

In contrast to performing etching each time the films for the transparent conductive film 2, the amorphous silicon film 3, and the metallic electrode film 4 are formed, as was done in the past, in the present invention the transparent conductive film 2, the amorphous silicon film 3, and the metallic electrode film 4 are formed continuously, with etching being performed all at once at the end. For this reason, there is no concern about surface contamination between films, and it is possible to obtain a high-quality solar cell.

As noted above, in a method of manufacturing a solar cell in which an electrode and an amorphous silicon film are laminated onto a substrate, by performing photolithography using the resolving power of the exposure system, it is possible to reduce the previously used three photolithography steps to one step, and also to reduce the number of masks required from three types to one.

Additionally, whereas etching has been performed three times in the past, this can be substantially reduced to one step. According to the present invention, therefore, there is a reduction to one-third in the process steps for manufacturing a solar cell, thereby enabling a great reduction in the cost of manufacturing.

What is claimed is:

1. A method of manufacturing a solar cell having a plurality of solar cell elements that are formed by a transparent conductive film, an amorphous silicon film, and a metallic electrode film on a substrate, said solar cell elements being in mutual proximity, wherein after a step which continuously laminates said transparent conductive film, said amorphous silicon film, and said metallic electrode film in this sequence on the substrate, patterning is performed of the laminate by using photolithography technology;

wherein said patterning is performed by one photoresist film application step and two etching steps;

said method further comprising a photoresist film patterning step whereby an aperture and at least two mask parts, each having a different thickness from each other, are formed in the photoresist film formed by the photoresist film application step; and wherein in said photoresist film patterning step, a mask part that has a thickness that is smaller than that of another mask part in said photoresist film is disposed so as to be adjacent to the aperture that is formed in the photoresist film.

2. A method for manufacturing a solar cell according to either claim 1, wherein said photoresist film patterning step uses a mask that has a light-transmitting part, a light-blocking part, and an impartially light-transmitting part, which transmits an amount of light that is intermediate between the amount of light transmitted by said light-transmitting part and the amount of light transmitted by said light-blocking part.

3. A method for manufacturing a solar cell according to claim 2, wherein said impartially light-transmitting part has a light-transmitting part that has a dimension that is below an amount of resolution of an exposure system.

4. A method for manufacturing a solar cell comprising a plurality of mutually neighboring solar cell elements that are formed by lamination of a transparent conductive film, an amorphous silicon film, and a metallic electrode onto a substrate, said method comprising:

a step of continuously laminating a transparent conductive film, an amorphous silicon film, and a metallic electrode onto a substrate;

a step of forming a photoresist film having a step in thickness on the laminate for the purpose of patterning the laminate on said substrate, and performing patterning so as to form an aperture at a location; and a step whereby, after a first etching using said photoresist film as a mask, said photoresist film is removed until a thin part of said photoresist film is removed, and a step of performing a second etching step with using the photoresist film that remains on the laminate.

5. A method of manufacturing a solar cell according to claim 4, further comprising a step of, after removal of the remaining photoresist film after said second etching step, forming a protective film that insulates said transparent conductive film and said metallic electrode within a solar cell element, or insulates transparent conductive film in neighboring solar cell elements, and a step of forming an electronically conductive paste via said protective film so as to make an electrical connection between said metallic electrode of one solar cell element in a solar cell and said transparent conductive film within another solar cell element in said solar cell.

6. A method of manufacturing a solar cell according to claim 4, wherein said first etching performs simultaneous patterning of said transparent conductive film, said amorphous silicon film, and said metallic electrode that form the laminate that correspond to an aperture of said photoresist film.

7. A method for manufacturing a solar cell according to any one of claims 4 through claim 6, wherein said second etching performs simultaneous patterning of said amorphous silicon film and said metallic electrode that corresponds to an aperture of said remaining photoresist film.

8. A method of manufacturing a solar cell having a plurality of solar cell elements that are formed by a transparent conductive film, an amorphous silicon film, and a metallic electrode film on a substrate, said solar cell elements being in mutual proximity, wherein after a step which continuously laminates said transparent conductive film, said amorphous silicon film, and said metallic electrode film in this sequence on the substrate, a first photoresist film is formed, which has an aperture at a position on the laminate, for the purpose of patterning the laminate, said first photoresist film being used as a mask to etch the laminate, thereby forming a trench that reaches said substrate at said position on the laminate, and simultaneously therewith, also causing a side end surface of said transparent conductive film to be recessed inwardly with respect to end surfaces of said metallic electrode and said amorphous silicon film, a protective film being formed by inserting a second photoresist film into a space that is formed by said side end surface of said transparent conductive film that is recessed and a bottom end surface of said amorphous silicon film.

9. A method of manufacturing a solar cell according to claim 8, wherein in the etching that uses the first photoresist film, etching conditions are used whereby the rate of etching said transparent conductive file is greater than the rate of etching of said metallic electrode film and said amorphous silicon film.

10. A method of manufacturing a solar cell having a plurality of solar cell elements that are formed by a transparent conductive film, an amorphous silicon film, and a metallic electrode film on a substrate, said solar cell elements being in mutual proximity, the method comprising:

a step of continuously laminating a transparent conductive film, an amorphous silicon film, and a metallic electrode film, in this sequence on the substrate;

a step of forming a first photoresist film having an aperture at a position on the laminate for the purpose of patterning the laminate;

a step whereby, when performing patterning by a first etching of the laminate, using said first photoresist film as a mask, etching is done using etching conditions under which the rate of etching of the transparent conductive film is greater than that of the metallic electrode film and the amorphous silicon film, thereby forming a trench that reaches said substrate at said position on the laminate, and simultaneously therewith causing a side end surface of said transparent conductive film to be recessed to the inside with respect to both end portions of said metallic electrode film and said amorphous silicon film;

a step whereby, after the removal of said first photoresist film, a second photoresist film is applied over the entire surface of the laminate, after which patterning is performed to said second photoresist film so that part of said trench and said metallic electrode film are open therein;

a step of using said second photoresist film as a mask to remove said metallic electrode film and said amorphous silicon film by etching; and a step of removing said second photoresist film that remains in part of a space, and then applying a third photoresist film to the entire surface of the laminate, after which said third photoresist film is partially removed, so as to leave a portion of said third photoresist film remaining in said space.

11. A method for manufacturing a solar cell according to claim 10, wherein said third photoresist film is made of a photosensitive resin.

12. A method for manufacturing a solar cell according to either claim 10 or claim 11, further comprising a step whereby, after removal of said third photoresist film, an electrically conductive paste is formed so as to make an electrical connection between the metallic electrode film of one solar cell element among a plurality of said solar cell elements and the transparent conductive film of a neighboring solar cell element.

13. A method of manufacturing a solar cell according to either claim 10 or claim 11, further comprising a step whereby, after removal of said third photoresist film, and after forming an electrical conduction film on the entire surface of the laminate, a fourth photoresist film is applied to the entire surface of the laminate, patterning being done so as to form an aperture at a part that corresponds to a part of said transparent conductive film and part of said metallic electrode film in one of the solar cell elements, and a step whereby the patterned fourth photoresist film is used as a mask to perform etching to remove a part of the transparent conductive film and a part of the metallic electrode film.

14. A method for manufacturing a solar cell according to claim 10, further comprising a step of forming a protective film so as to insulate within said solar cell elements or so as to insulate between transparent conductive films of neighboring solar cell elements, and a step of forming an electrically conductive paste so that an electrical connection is made between the metallic electrode film of one solar cell element of neighboring solar cell elements and the transparent conductive film of the solar cell element of another neighboring solar cell element.

* * * * *

UNITED STATES PATENT AND TRADEMARK OFFICE
CERTIFICATE OF CORRECTION

PATENT NO.     : 6,323,056 B1
DATED          : November 27, 2001
INVENTOR(S)    : Kozo Miyoshi It is certified that error appears in the above-identified patent and that said Letters Patent is hereby corrected as shown below:

<u>Column 15,</u>
Line 42, delete the word "either".

Signed and Sealed this

Eighteenth Day of June, 2002

*Attest:*

JAMES E. ROGAN
*Attesting Officer*   *Director of the United States Patent and Trademark Office*